United States Patent [19]

Sato

[11] 4,355,413

[45] Oct. 19, 1982

[54] PHASE LOCKED LOOP CIRCUIT

[75] Inventor: Tsutomu Sato, Kanagawa, Japan

[73] Assignee: Sony Corporation, Tokyo, Japan

[21] Appl. No.: 214,740

[22] Filed: Dec. 9, 1980

[30] Foreign Application Priority Data

Dec. 10, 1979 [JP] Japan .............................. 54-160086

[51] Int. Cl.³ .................. H04B 1/26; H03L 7/18; H03L 7/24

[52] U.S. Cl. .................................... 455/183; 331/17; 455/208; 455/260

[58] Field of Search ............... 331/17; 455/183, 208, 455/260, 76, 77, 165

[56] References Cited

U.S. PATENT DOCUMENTS 2,676,262  4/1954  Hugenholtz ......................... 331/17
4,097,810  6/1978  Aschwanden ..................... 455/183

FOREIGN PATENT DOCUMENTS 2812377  9/1979  Fed. Rep. of Germany ........ 331/17

Primary Examiner—Marc E. Bookbinder

Attorney, Agent, or Firm—Lewis H. Eslinger; Alvin Sinderbrand

[57] ABSTRACT

A phase locked loop circuit includes a reference signal oscillator, a voltage controlled oscillator providing an output oscillation signal at its output, a programmable divider connected to the output of the voltage controlled oscillator, a phase comparator supplied with output signals from both the reference signal oscillator and the programmable divider to produce an error signal in response to the phase difference therebetween, and an active low pass filter for processing the error signal to produce a DC control signal supplied to the voltage controlled oscillator to lock the phase of the output oscillation signal to that of the reference signal. This low pass filter includes a time constant circuit whose time constant governs the transfer function of the filter and a damping factor control circuit to adjust the time constant of the time constant circuit in accordance with the level of the DC control signal. The phase locked loop circuit of this invention is favorably applied in an FM broadcast receiver to provide a tuning signal over an extended range, for example, a range encompassing both the FM band of the U.S. and that of Japan.

14 Claims, 6 Drawing Figures

PHASE LOCKED LOOP CIRCUIT

BACKGROUND OF THE INVENTION

1. Field of the Invention

The present invention relates to a phase locked loop circuit and more particularly relates to a phase locked loop circuit with a damping factor control circuit.

2. Description of the Prior Art

In the past few years, PLL (phase locked loop) frequency synthesizer tuners, which use PLL circuits as local oscillation circuits, have been generally employed. Such tuners have enjoyed considerable use in portable FM radio receivers. In such tuner, when it is desired to receive a particular broadcast station at a given frequency, the frequency dividing ratio N of a programmable divider in the PLL circuit is selected to correspond to the frequency of the desired broadcast station. In this case, the frequency is selected from a broadcast band of, for example, 76.1 MHz to 89.9 MHz in Japan, 87.9 MHz to 107.9 MHz in the United States, and 87.5 MHz to 108 MHz in Europe. Therefore, if a "world traveller" type FM receiver is constructed so that both the frequency band of Japan and that of the United States are to be spanned, the range of possible dividing ratios becomes rather large. However, the damping factor of the PLL circuit is lowered by any significant increase of the dividing ratio N and, as a result, the frequency synthesizer tuner in such an FM receiver might be unable to stably lock onto the frequency of the desired FM station.

Heretofore, there has not been proposed a PLL circuit including a damping factor control circuit to avoid the above defect, and which would be sufficiently simple in construction to justify its use in a portable FM receiver.

OBJECTS AND SUMMARY OF THE INVENTION

Accordingly, it is an object of the present invention to provide a PLL circuit free from this drawback encountered in the prior art.

It is another object of the invention to provide a PLL circuit in which its damping factor is automatically controlled by the control voltage of the PLL circuit.

It is a further object of the invention to provide a PLL circuit in which the time constant of the low pass filter included therein is automatically adjusted by the control voltage of the PLL circuit in the sense to permit the PLL circuit to lock-in stably over a wide range of frequencies.

In accordance with one embodiment of the present invention, a phase locked loop circuit comprises a reference signal oscillator generating a reference signal; a voltage controlled oscillator (VCO) providing an output oscillating signal whose frequency depends on the level of a DC control signal applied to the VCO; a programmable divider having an input connected to receive the output oscillating signal and an output providing a divided-down signal; a phase comparator circuit having inputs respectively coupled to receive the reference signal and the divided-down signal and providing an error signal whose level corresponds to the phase difference therebetween; and a low pass filter arrangement coupled between the phase comparator circuit and the VCO for processing the error signal to produce the DC control signal to lock the phase of the output oscillating signal to that of the reference signal.

According to this invention, the low pass filter arrangement has a time constant circuit whose time constant establishes the transfer function of the filter arrangement, and a control circuit coupled to the time constant circuit to adjust its time constant in accordance with the level of the DC control signal. The time constant circuit can be formed, for example, as a capacitor and a first resistor coupled in series, and the control circuit can be a series circuit, formed of a transistor and a second resistor, in parallel with the first resistor. An input electrode of the transistor is coupled to receive the DC control signal, and another electrode thereof is coupled to a point of fixed potential. Thus, the transistor is turned on when the DC control level reaches a threshold voltage determined by the fixed potential, and thereby alters the transfer function of the filter arrangement.

Other objects, features, and advantages of this invention will become apparent from the ensuing description of a preferred embodiment thereof, when read in conjunction with the accompanying drawings, throughout which like references identify the same elements and parts.

DESCRIPTION OF A PREFERRED EMBODIMENT

As background for the present invention and to provide a clearer understanding thereof, an example of the prior-art PLL circuit will be now described with reference to FIG. 1 and the graphs of FIGS. 2 and 3.

Figure 1:
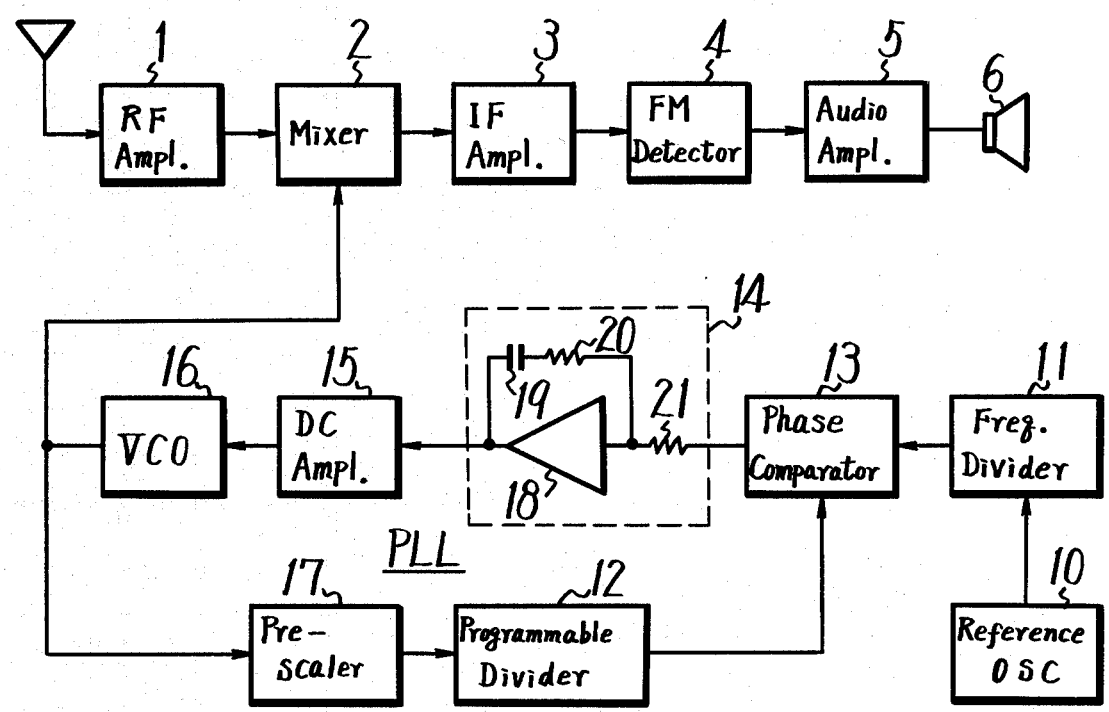
FIG. 1 is a systematic block diagram showing an example of an FM receiver incorporating a prior art PLL circuit.

In FIG. 1, the PLL circuit is applied to a radio receiver, which, for example, can be an FM radio receiver with a wide frequency band whose receiving frequency range is selected as 76 MHz to 108 MHz to cover the FM bands of both Japan and the United States. In such radio receiver, an RF (radio frequency) amplifer circuit 1 receives an RF signal through an antenna A. The RF signal received by the RF amplifier circuit 1 is supplied therefrom to a mixer circuit 2 and received RF signal is frequency-converted therein into an IF (intermediate frequency) signal by mixing it with a local oscillation frequency signal. Here, such a signal is generated in a PLL circuit which serves as a local oscillator circuit. If, in this example, a lower frequency heterodyne system is used, respective local oscillation signals of frequencies in the range of 65.3 to 97.3 MHz have to be fed from the PLL circuit to the mixer circuit 2 to tune in the respective RF signals of frequencies 76 MHz to 108 MHz. The output of the mixer circuit 2 is an IF signal with a center frequency of 10.7 MHz.

The IF signal from the mixer 2 is then applied to an IF amplifier 3, in which it is amplified and thence furnished to a frequency detector circuit 4. The output signal therefrom is supplied to a low, or audio frequency amplifier circuit 5 and thence to a speaker 6 or other acoustic transducer to provide audio frequency sound or other information carried on the RF signal.

The conventional PLL circuit is formed of a reference oscillator 10 generating a reference oscillating signal which is divided down in a frequency divider 11; a programmable divider 12 to be described later; a phase comparator circuit 13 having inputs respectively coupled to the frequency divider 11 and to the programmable divider 12 to generate an error signal corresponding to the phase difference as between the divided-down reference oscillating signal and the output of the programmable divider 12; a low pass filter 14 following the phase comparator circuit 13 to process the error signal; and a DC amplifier circuit 15 amplifying the processed error signal from filter 14 and applying it as a DC control signal to a VCO (voltage-controlled oscillator) 16. The VCO 16 then provides an output oscillating signal as a tuning signal to the mixer 2 and as a feedback signal through a pre-scaler 17 and the programmable divider 10 as a divided down output signal to the phase comparator circuit 13. In this case, because the PLL circuit is used for tuning an FM receiver, the reference oscillator 10 preferably generates a reference signal of, for example, 100 KHz; thus, the frequency divider 11 frequency-divides the frequency of the reference oscillating signal by a factor of twenty. The low pass filter 14 removes noise components and high frequency components from the error signal provided from the phase comparator 13 and thereby serves as a hold circuit to stabilize the loop even when the PLL circuit is released or "unlocked" from its locked stable condition for any reason. The VCO 16 is controlled so that the output oscillation frequency thereof varies in response to the filtered and amplified compared error signal from the DC amplifier 15. The pre-scaler 17 frequency-divides the oscillation output signal frequency from the VCO 16 by a dividing factor that is substantially the same as that of the frequency divider 11. Of course, depending on circuit design, the DC amplifier 15 may be omitted.

As the low pass filter 14, a so-called active filter of the R-C type is favorably employed. Such a filter is conventionally formed of, for example, an operational amplifier 18, a series connection of a capacitor 19 and a resistor 20 connected between the output terminal and an input terminal of the operational amplifier 18, and a resistor 21 provided at the input terminal of the operational amplifier 18. Although not shown herein, the input terminal used is the inverting input terminal of the operational amplifier 18, the non-inverting input terminal thereof being grounded.

The programmable frequency divider 12 is a kind of a variable frequency divider in which if a desired numerical value, or divisor, for a frequency dividing operation is logically programmed therein, an oscillating input signal thereto is frequency-divided by a factor corresponding to the programmed numerical value.

When the input signal to be processed has a frequency that is too high to be frequency-divided by the programmable divider 12, a pre-scaler, such as the pre-scaler 17, must be provided at the input of the divider 12 as shown in FIG. 1 to reduce the frequency at the input thereof to a value which can be frequency-divided by the programmable divider 12.

In general, the limit of the input frequency for which the programmable divider 12 can be used is several MHz, so that in the example of FIG. 1 the oscillation frequencies 65.3 to 97.3 MHz of the VCO 16 are frequency-divided through the pre-scaler 17 by a factor of twenty. Thus, the input frequency to the programmable divider 12 is 3.265 to 4.865 MHz. Such input frequency is then frequency-divided by the programmable divider 12 to a resulting frequency equal to that of the signal from the frequency divider 11, nominally 5 KHz. That is, the input frequencies 3.265 to 4.865 MHz are frequency-divided in the programmable divider 12 by appropriate factors ranging from 653 to 973.

The frequency divider ratio of the loop, that is, the frequency dividing ratio N of the output oscillation frequency of the VCO 16 to the input frequency to the phase comparator 13 is expressed as the product of the frequency dividing ratio of the pre-scalar 17 times that of the programmable divider 12. Such loop frequency dividing ratio ranges from 13060 to 19460 (20×653 to 20×973) in this example. This value is rather large, and the variance in the ratio between its maximum and minimum is about 1.5, which is also rather large.

When the frequency dividing ratio N and the varying ratio are both large, the PLL circuit has a drawback in that it is difficult, owing to the influence of the delay time of the loop and also owing to other factors, to properly adjust the respective parameters of the low pass filter 14. For the same reasons, the frequency response range thereof is limited.

In the case in which, as here, the PLL circuit is provided in a portable radio receiver, it can be stated generally that the damping factor $\xi$ of the loop is selected to be relatively large within the range of its suitable values. This damping factor $\xi$ is a parameter to determine the transient response characteristic of the loop and is expressed as follows:

$$\xi = \frac{\tau_2}{2}\left(\frac{K}{\tau_1 N}\right)^{\frac{1}{2}}$$

where $\tau_1$ and $\tau_2$ are the time constants of the low pass filter 14 such that $\tau_1 = R_1 C$ and $\tau_2 = R_2 C$; K is the loop gain, i.e., the product of the conversion gain of the phase comparator 13, the gain of the operational amplifier 18, the voltage gain of the DC amplifier 14, and the voltage-frequency conversion gain of the VCO 16; $R_1$ is the resistance value of the resistor 21; $R_2$ is the resistance value of the resistor 20; and C is the capacitance value of the capacitor 19.

Generally speaking, a PLL circuit oscillates in a sustained oscillation state at its natural frequency (that is, the oscillation angular frequency when the loop is subjected to sustained oscillations) when the damping factor $\xi$ is zero ($\xi = 0$), but oscillates in an attenuation oscillation state when $0 < \xi < 1$. When $\xi = 1$, the PLL circuit is in a so-called critical braking state. Lastly, when $\xi > 1$, the PLL circuit does not oscillate but only attenuates.

Accordingly, the PLL circuit is stably phase-locked when the damping factor $\xi$ is too much greater than its suitable, or ideal value and is liable to be influenced by external oscillations and noise when $\xi$ is small, as indicated above. Therefore, it is desired that the damping factor $\xi$ remain substantially constant for a predetermined frequency range, and the suitable value of the damping factor $\xi$ is favorably set between 0.6 and 0.8, depending upon the selected frequency dividing ratio.

Figure 2:
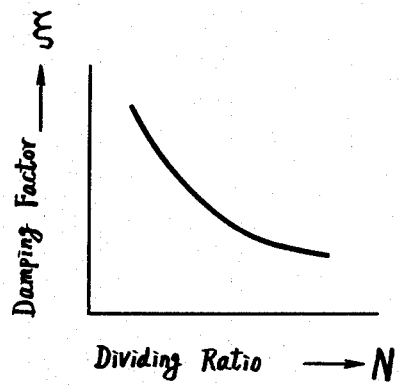
FIG. 2 and 3 are graphs used to explain the operation of the PLL circuit shown in FIG. 1.
Figure 3:
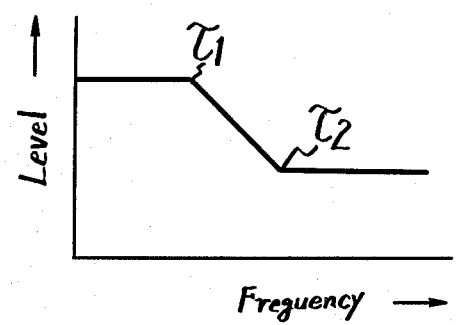

In the conventional PLL circuit, the damping factor $\xi$ varies in reverse proportion to the square root of the frequency dividing ratio N as shown in the graph of FIG. 2. Accordingly, where the varying ratio of the frequency dividing ratio N is large, for example, 1.5 as set forth above, it is difficult to make the damping factor $\xi$ constant if the time constants $\tau_1$ and $\tau_2$ of the low pass filter 14 are permanently set. As a result, if the dividing factor N is changed to an extreme value thereof, phase lock is lost, and the PLL circuit is easily affected by external oscillations and noise. Further, when the varying range of the frequency dividing ratio N is large, for example, 13060 to 19460 as set forth above, the range of the optimum or suitable values of the damping factor $\xi$ becomes extremely narrow because of the delay of the loop so that the range of dividing ratio N that can be accommodated is limited, and this can adversely result in phase lock being lost.

When the varying ratio of the frequency dividing ratio N is large, the frequency characteristic of the low pass filter 14 becomes narrow because of the phase delay generated in the frequency divider 12, 17, so that it becomes necessary to vary the frequency characteristic of the filter 14. In the conventional low pass filter 14, since its frequency response characteristic (i.e., its transfer function) is determined by the fixed time constants $\tau_1$ and $\tau_2$ as shown in the graph of FIG. 3, it is not possible to vary the frequency characteristic in response to changes in the frequency dividing ratio N. Accordingly, the response speed of the loop is generally deteriorated when the dividing ratio N is selected at an extreme value.

An embodiment of the PLL circuit according to the present invention, which is simple in construction, which avoids the above defects inherent to the conventional PLL circuit, and whose damping factor is substantially constant within a relatively wide predetermined range of dividing ratios N to improve the various characteristics thereof, will be now described with reference to FIGS. 4 to 6.

Figure 4:
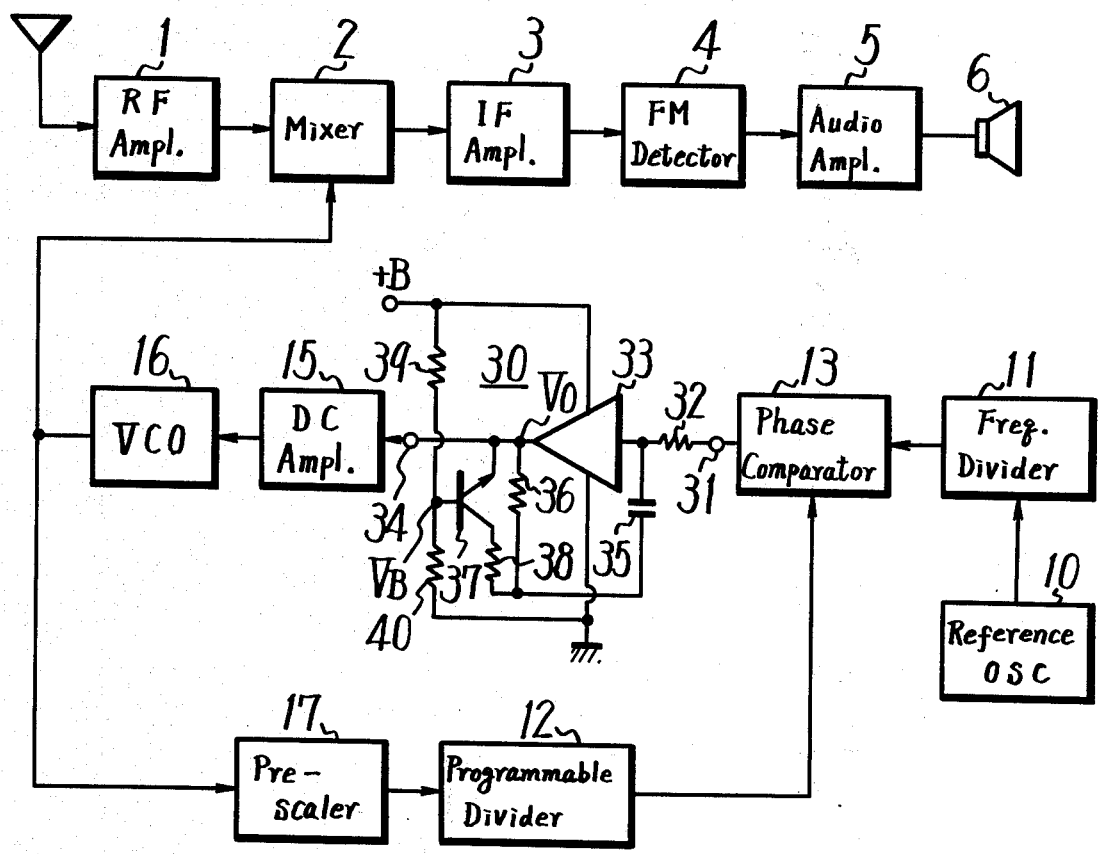
FIG. 4 is a systematic block diagram showing an example of an FM receiver incorporating a PLL circuit embodying the present invention.

FIG. 4 is a block diagram showing an example of an FM receiver incorporating an embodiment of the PLL circuit according to this invention, in which the elements in common with those in the example of FIG. 1 are identified with the same reference characters and their description is omitted.

In FIG. 4, an active low pass filter 30 has an input terminal 31 to which the output signal from the phase comparator circuit 13 is applied. This input terminal 31 is connected through a resistor 32 to the inverting input terminal of an operational amplifier 33 whose non-inverting input terminal is grounded and whose output terminal is in turn connected to a filter output terminal 34. The output signal from low pass filter 30 is supplied through the output terminal 34 to the DC amplifier circuit 15. This DC amplifier circuit 15 may, of course, be omitted, depending upon the circuit design.

A series feedback loop formed of a capacitor 35 and a resistor 36 is coupled to the operational amplifier 33 with the capacitor 35 being coupled to the inverting input terminal of the operational amplifier and the resistor 36 coupled to the output terminal thereof. A series arrangement formed of an NPN transistor 37 and a resistor 38 is coupled in parallel to the resistor 36, with the emitter of the transistor 37 being coupled to the output terminal of the operational amplifier 33, the collector thereof being connected to one end of the resistor 38, the other end of which is coupled to the junction of the capacitor 35 and the resistor 36.

A series biasing arrangement, including resistors 39 and 40 connected as a voltage divider between a voltage source of voltage +B and ground, has the voltage dividing point thereof connected to the base of the transistor 37 to apply a bias voltage $V_B$ thereto. The operational amplifier 33 is supplied with power from the voltage source and the non-inverting input terminal thereof is coupled to ground.

The remaining circuit construction of the example shown in FIG. 4 is substantially the same as that of the example shown in FIG. 1.

The operation of the PLL circuit of this invention, as shown in FIG. 4, will now be explained. It is assumed that the output voltage at the output terminal of the operational amplifier 33 is $V_O$ and the base voltage of the transistor 37 is $V_B$. When $V_O = V_B$, the transistor 37 is in its OFF (non-conducting) state. Thus, the time constant $\tau_1$ of the low pass filter 30 is $R_1 C$ ($\tau_1 = R_1 C$) and the time constant $\tau_2$ can be expressed as $\tau_2 = \tau_{21}$, i.e., $\tau_{21} = R_{21} C$, where $R_1$ and $R_{21}$ are the resistance values of the resistors 32 and 36, respectively, and C is the capacitance value of the capacitor 35. In the case that the frequency dividing ratio N is small, then the frequency of the output oscillating signal from the VCO 16 is also low and the control voltage applied thereto becomes correspondingly small. Thus, when $V_O < V_B$, the transistor 37 turns ON. In this case, the time constant $\tau_1$ is the same as that when $V_O = V_B$, but the time constant $\tau_2$ becomes $\tau_{22} = (R_{21} || R_{22}) C$ where $R_{22}$ is the composite impedance value formed of the resistance value of the resistor 38 and the output impedance of the transistor 37. Accordingly, in this case, the transistor 37 serves as a variable impedance element. The notation $R_{21} || R_{22}$ indicates the equivalent parallel impedance of the resistor 36 and the series circuit formed of the resistor 38 and transistor 37.

Figure 5:
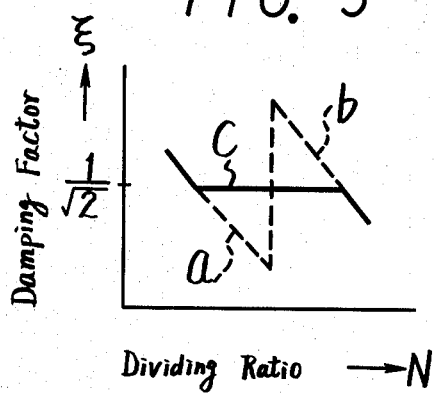
FIG. 5 and 6 are graphs used to explain the operation of the PLL circuit of the invention shown in FIG. 4.

FIG. 5 is a graph showing the relation of the damping factor $\xi$ of the PLL circuit to the frequency dividing ratio N when the low pass filter 30 is employed. In the graph of FIG. 5, broken lines a and b are respectively characteristic curves indicating the effect of resistance $R_{21}$ and $(R_{21} || R_{22})$, and solid line c is a characteristic curve based upon the composite effect of the above characteristics. From the graph of FIG. 4, it will be understood that if the time constant $\tau_2$ is varied in response to the output $V_O$ from the operational amplifier 33, notwithstanding any variation of the dividing ratio N, the damping factor $\xi$ can be made constant at an adequate value, for example, $$\frac{1}{\sqrt{2}},$$

within a sufficiently broad predetermined range.

Figure 6:
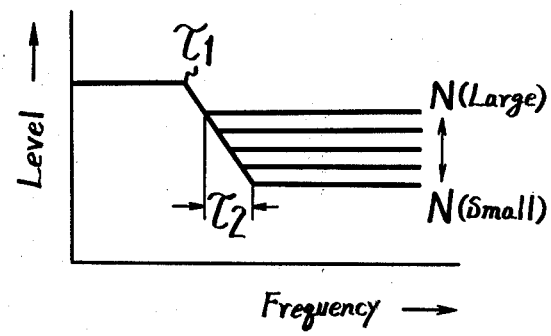

FIG. 6 is a graph showing the frequency characteristic of the low pass filter 30. From this graph, it will be understood that a region of constant level extends to a frequency depending on the time constant $\tau_1$, followed by a region of negative slope with a gradient of 6 dB/oct that extends to a frequency depending on time constant $\tau_2$, followed in turn by a region of constant level. The level in this last region can be varied by varying the time constant $\tau_2$. In other words, when the dividing ratio N is large, the frequency characteristic is expanded, but when the dividing ratio N is small, the frequency characteristic is narrowed.

As described above, according to the present invention, the time constant of the low pass filter 30 is changed in response to the control voltage for the VCO 16 in the sense to make the damping factor $\xi$ of the PLL circuit remain within the predetermined range, so that extreme variations in the damping factor $\xi$ can be prevented. Thus, even if the frequency dividing ratio N of the loop is large, and even if the ratio of maximum to minimum values of this frequency dividing ratio N is large, loss of phase lock is avoided and the PLL circuit is not significantly affected by external oscillations and noise.

Further, according to this invention, since the frequency characteristic of the low pass filter 30 can be automatically altered in response to a change in the frequency dividing ratio, the PLL circuit can respond very quickly to phase changes without incurring large loop delays.

Further, since the range of variation of the damping factor $\xi$ of the PLL circuit is narrow according to this invention, the parameters of the low pass filter can be selected from over a very wide range.

Also, in this invention the control signal for changing the time constant of the low pass filter is the control voltage for the VCO, rather than some specially generated signal, so that it is unnecessary to provide any special circuitry, such as a changeover detecting circuit or the like. As a result, the circuit construction according to this invention remains simple.

Further, according to this invention, the DC control voltage for the VCO is itself used as a changeover signal to control actuation of the transistor 37. As a result, the PLL circuit is not significantly influenced by external factors. In other words, variations in voltage value of the control voltage for the VCO 16 at the time that the transistor 37 is turned ON or OFF is low.

In addition, if at least one of the resistance values of the biasing resistors 39 and 40 is variable, the changeover level, i.e., the base voltage $V_B$ of the transistor 37, can be selected at any desired value.

Also, while a junction NPN transistor is shown as the transistor 37, other devices, such as an FET or other integratable transistor device, could be used instead.

While a single preferred embodiment of the present invention has been described hereabove, it will be apparent that many modifications and variations could be effected by one skilled in the art without departing from the spirit or scope of this invention, which is determined by the appended claims.

What is claimed is:

1. In a phase locked loop circuit comprising reference signal oscillator means providing a reference signal; voltage controlled oscillator means providing an output oscillation signal whose frequency varies in accordance with a DC control signal applied thereto; programmable divider means having an input connected to receive the output oscillation signal from said voltage controlled oscillator means and an output providing a divided-down signal over a range; phase comparator means having inputs respectively coupled to receive said reference signal and said divided-down signal and an output providing an error signal in response to the phase difference therebetween; and low pass filter means coupled between said phase comparator means and said voltage controlled oscillator means and supplied with said error signal for producing said DC control signal to lock the phase of the output oscillation signal to that of the reference signal, and having a time constant circuit whose time constant establishes the transfer function of the low pass filter means; the improvement wherein said low pass filter means includes control means coupled to said time constant circuit to adjust the time constant thereof in accordance with the level of said DC control signal such that the low pass filter means has a damping factor that is substantially a constant over said range of the divided-down signal.

2. A phase locked loop circuit according to claim 1, wherein said low pass filter means includes an active filter formed of an operational amplifier and said time constant circuit, said operational amplifier having an input and an output, said time constant circuit including a series circuit, formed of a capacitor and a resistor, coupled between the output and the input of the operational amplifier, and said control means being coupled with least a portion of said series circuit and with the output of said operational amplifier.

3. A phase locked loop circuit according to claim 2, wherein said time constant circuit includes another resistor coupled between said phase comparator means and the input of said operational amplifier, so that said other resistor and said capacitor form a first time constant circuit portion having a first time constant and said capacitor and the first-mentioned resistor form a second time constant circuit portion having a second time constant, and said control means is coupled to the second time constant circuit portion to control the second time constant.

4. In a phase locked loop circuit comprising reference signal oscillator means providing a reference signal; voltage controlled oscillator means providing an output oscillation signal whose frequency varies in accordance with a DC control signal applied thereto; programmable divider means having an input connected to receive the output oscillation signal from said voltage controlled oscillator means and an output providing a divided-down signal; phase comparator means having inputs respectively coupled to receive said reference signal and said divided-down signal and an output providing an error signal in response to the phase difference therebetween; and an active low pass filter coupled between said phase comparator means and said voltage controlled oscillator means and supplied with said error signal for producing said DC control signal to lock the phase of the output oscillation signal to that of the reference signal, and having a time constant circuit whose time constant establishes the transfer function of the low pass filter, the latter being formed of an operational amplifier and said time constant circuit, said operational amplifier having an input and an output, said time constant circuit including a series circuit, formed of a capacitor and a resistor, coupled between the output and the input of the operational amplifier, wherein said series circuit is arranged with said capacitor and the resistor respectively connected to the input and the output of the operational amplifier; the improvement wherein said low pass filter includes control means coupled to said time constant circuit to adjust the time constant thereof in accordance with the level of said DC control signal, with said control means being coupled in parallel with said resistor.

5. A phase locked loop circuit according to claim 4, wherein said control means includes a transistor having an input electrode coupled to the output of the operational amplifier, a control electrode, and an output electrode, said input and output electrodes defining a main current path; a third resistor coupled between said output electrode and said capacitor; and means holding said control electrode at a predetermined voltage.

6. A phase locked loop circuit according to claim 5, wherein said means holding the control electrode is arranged such that said transistor is turned ON when the DC control signal reaches a threshold value to connect said third resistor in parallel with said first-mentioned resistor.

7. A phase locked loop circuit according to claim 5; wherein said transistor includes an NPN junction transistor having an emitter, a collector, and a base respectively forming said input, output, and control electrodes, so that the current path formed by said emitter and collector thereof forms the main current path of the transistor.

8. A phase locked loop circuit according to claim 5, wherein said means holding said control electrode includes a voltage divider circuit coupled between two DC reference levels and having a dividing point coupled to said control electrode.

9. A phase locked loop circuit according to claim 2, wherein said operational amplifier has inverting and non-inverting inputs, said inverting input forms the input of the operational amplifier to which said first resistor and said series circuit are coupled, and said non-inverting input is coupled to a reference level.

10. A phase locked loop circuit according to claim 1, wherein said programmable divider means includes a programmable divider circuit having an output providing said divided-down signal and an input; and a prescaler coupled between said voltage controlled oscillator means and the input of said programmable divider circuit.

11. A phase locked loop circuit according to claim 1, wherein said phase comparator means includes frequency divider means, coupled to said reference signal oscillator means, to divide down said reference signal.

12. An FM radio receiver comprising receiving means for receiving an FM broadcast signal within an FM broadcast band; detector means for detecting information carried on said FM broadcast signal; and tuning means coupled between said receiving means and said detector means formed of a phase locked loop circuit for generating a tuning signal and mixer means for mixing said tuning signal with said FM broadcast signal to provide a tuned signal to said detector means; said phase locked loop circuit including reference signal oscillator means providing a reference signal; voltage controlled oscillator means providing said tuning signal at a frequency depending upon a DC control voltage applied thereto; a prescaler having an input coupled to receive the tuning frequency and an output; a programmable divider having an input coupled to the output of the prescaler and an output providing a divided-down signal over a range corresponding to said FM broadcast band; phase comparator means having inputs respectively coupled to receive said reference signal and said divided-down signal and providing an error signal in response to the phase difference therebetween; and an active low pass filter coupled between said phase comparator means and said voltage controlled oscillator means and having an input to which said error signal is applied, an output at which said DC control signal appears, a time constant circuit whose time constant establishes the transfer function of the active low pass filter, and control circuit means for adjusting the time constant of said time constant of said time constant circuit in accordance with the level of said DC control signal, said control circuit means controlling said low pass filter means to have a damping factor that is substantially constant over said range of said divided-down signal.

13. An FM radio receiver comprising receiving means for receiving an FM broadcast signal; detector means for detecting information carried on said FM broadcast signal; and tuning means coupled between said receiving means and said detector means formed of a phase locked loop circuit for generating a tuning signal and mixer means for mixing said tuning signal with said FM broadcast signal to provide a tuned signal to said detector means; said phase locked loop circuit including reference signal oscillator means providing a reference signal; voltage controlled oscillator means providing said tuning signal at a frequency depending upon a DC control voltage applied thereto; a prescaler having an input coupled to receive the tuning frequency and an output; a programmable divider having an input coupled to the output of the prescaler and an output providing a divided-down signal, wherein said programmable divider is adapted to provide a range of divided-down signals corresponding to a range of FM broadcast signal frequencies of approximately 76 MHz to 108 MHz; phase comparator means having inputs respectively coupled to receive said reference signal and said divided-down signal and providing an error signal in response to the phase difference therebetween; and an active low pass filter coupled between said phase comparator means and said voltage controlled oscillator means and having an input to which said error signal is applied, an output at which said DC control signal appears, a time constant circuit whose time constant establishes the transfer function of the active low pass filter, and control circuit means for adjusting the time constant of said time constant circuit in accordance with the level of said DC control signal, wherein said control circuit means controls said low pass filter to have a damping factor that is substantially constant over such range of divided-down signals.

14. A phase locked loop circuit according to claim 4, wherein said time constant circuit includes another resistor coupled between said phase comparator means and the input of said operational amplifier, so that said other resistor and said capacitor form a first time constant circuit portion having a first time constant and said capacitor and the first-mentioned resistor form a second time constant circuit portion having a second time constant, and said control means is coupled to the second time circuit portion to control the second time constant.

* * * * *